United States Patent [19]

Hyman

[11] Patent Number: 5,253,363
[45] Date of Patent: Oct. 12, 1993

[54] METHOD AND APPARATUS FOR COMPILING AND IMPLEMENTING STATE-MACHINE STATES AND OUTPUTS FOR A UNIVERSAL CELLULAR SEQUENTIAL LOCAL ARRAY

[76] Inventor: Edward Hyman, 1644 Curtis Ave., Manhattan Beach, Calif. 90266

[21] Appl. No.: 614,686
[22] Filed: Nov. 15, 1990

Related U.S. Application Data

[63] Continuation of Ser. No. 168,376, Mar. 15, 1988, abandoned.
[51] Int. Cl.$^5$ .......................................... H03K 19/177
[52] U.S. Cl. ..................................... 395/800; 364/716; 364/931.01; 364/931.1; 364/965.82; 364/977.5; 364/DIG. 2; 307/465; 307/465.1; 340/825.83
[58] Field of Search ................... 364/DIG. 1, DIG. 2, 364/716, 488, 489, 490; 307/465, 465.1; 340/825.83; 395/800

[56] References Cited

U.S. PATENT DOCUMENTS

| | | | |
|---|---|---|---|
| 3,473,160 | 10/1969 | Wahstrom | 364/900 |
| 3,619,583 | 11/1971 | Arnold | 364/716 |
| 3,731,073 | 5/1973 | Moylan | 364/716 |
| 3,855,536 | 12/1974 | Neuner | 307/465 |
| 3,987,286 | 10/1976 | Muehldorf | 364/716 |
| 4,215,401 | 7/1980 | Holsztynski et al. | 364/200 |
| 4,293,783 | 10/1981 | Patil | 364/716 |
| 4,450,520 | 5/1984 | Hollaar et al. | 364/200 |
| 4,504,904 | 3/1985 | Moore et al. | 364/200 |
| 4,541,071 | 9/1985 | Ohmori | 364/900 |
| 4,574,394 | 3/1986 | Holsztynski et al. | 395/800 |
| 4,591,980 | 5/1986 | Huberman et al. | 395/800 |
| 4,677,587 | 6/1987 | Zemany, Jr. | 364/900 |
| 4,694,411 | 9/1987 | Burrows | 364/578 |
| 4,697,241 | 9/1987 | Lavi | 364/488 |
| 4,703,435 | 10/1987 | Darringer | 364/489 |
| 4,709,327 | 11/1987 | Hillis et al. | 395/800 |
| 4,727,493 | 2/1988 | Taylor, Sr. | 364/900 |
| 4,758,745 | 7/1988 | Elgamal et al. | 307/465 |
| 4,758,953 | 7/1988 | Morita et al. | 364/300 |
| 4,791,602 | 12/1988 | Resnick | 364/716 |
| 4,792,909 | 12/1988 | Serlet | 364/491 |
| 4,814,973 | 3/1989 | Hillis | 395/800 |
| 4,839,851 | 6/1989 | Maki | 395/800 |
| 4,845,633 | 7/1989 | Furtek | 364/490 |
| 4,855,903 | 8/1989 | Carleton et al. | 395/325 |
| 4,918,440 | 4/1990 | Furtek | 340/825.83 |
| 4,963,768 | 10/1990 | Agrawel et al. | 307/465 |
| 5,070,446 | 12/1991 | Salem | 395/500 |

OTHER PUBLICATIONS

Hyman, E., *Minimal Complexity Universal Cellular Arrays*, A Dissertation, University of Southern California (Jan. 1974).
George H. Williams, "Array State Assignments in Sequential Circuit Synthesis" (Ph.D. Dissertation, Engineering, Electrical), Yale University Press, 1970.
Monroe M. Newborn, Thomas F. Arnold, "Universal Modules for Bounded Signal Fan-Out Synchronous Sequential Circuits," *IEEE* (vol. C-21, No. 1, Jan. 1972).
a

*Primary Examiner*—Joseph L. Dixon
*Assistant Examiner*—Matthew C. Fagan
*Attorney, Agent, or Firm*—Charles Berman

[57] ABSTRACT

A universal sequential logic circuit is constructed from a rectilinear array of elementary logic "cells", with a relatively large number of logic states embodied in a relatively small array. The set of states from a state-machine description of the logic function desired to be performed is compiled into a software association of cellular array states with each state-machine state, and the set of transitions from the state-machine description is compiled into a software association of logical connections between cells. The cellular array performs the state-machine function under software control. The rectilinear array generally embodies one bit of cellular array state information for each row of logic cells, stored in diagonal cells of the array called "memory cells". Non-diagonal cells of the array called "function cells" are controlled by stored software, which controls the transfer of cellular array state information from each row to each other. Equivalence classes of state-machine states with respect to sequences of inputs are compiled, and one memory cell state is assigned to each such equivalence class. The function cells select which cellular array state follows the present one by selecting which logic state each memory cell in the array is to store next, each using a multiplexor under the control of stored memory bits.

13 Claims, 5 Drawing Sheets

MEMORY CELL

FUNCTION CELL

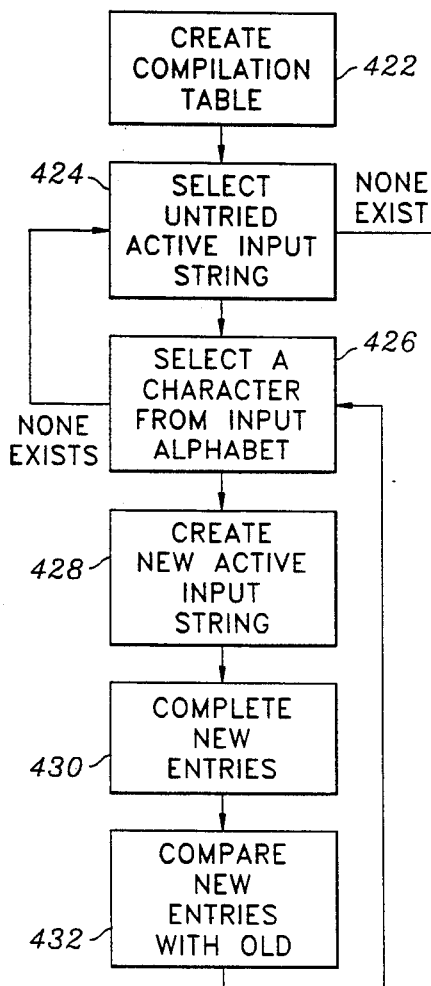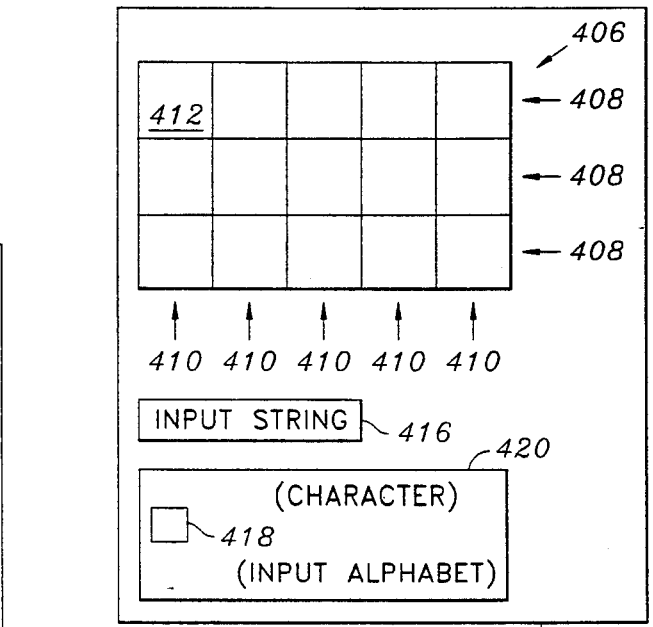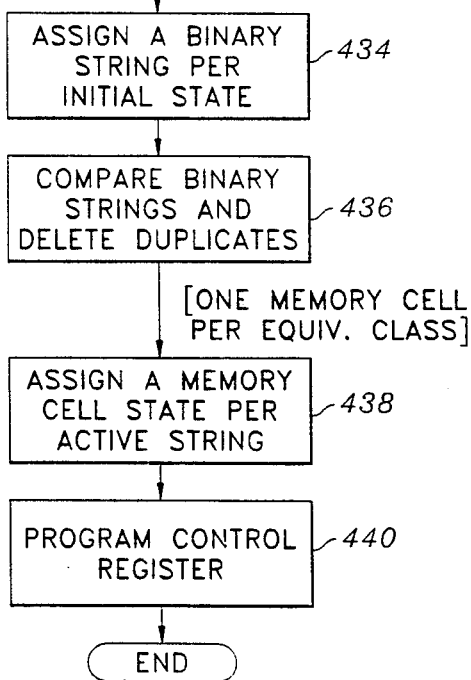
FIG. 4B
FIG. 4A

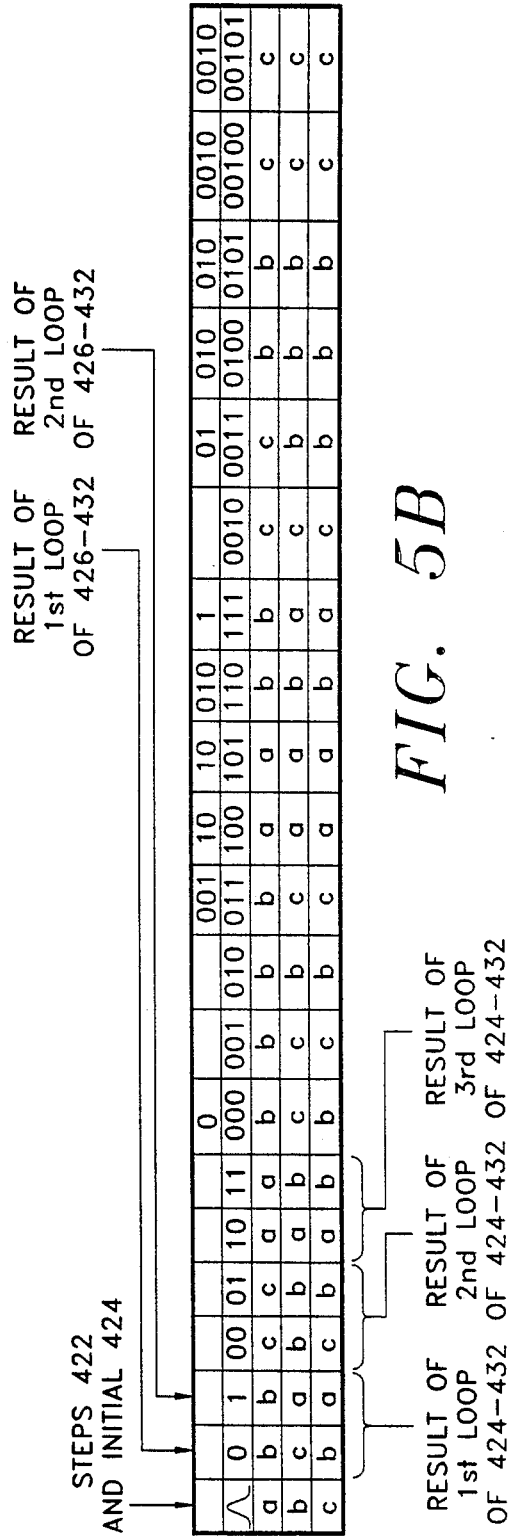
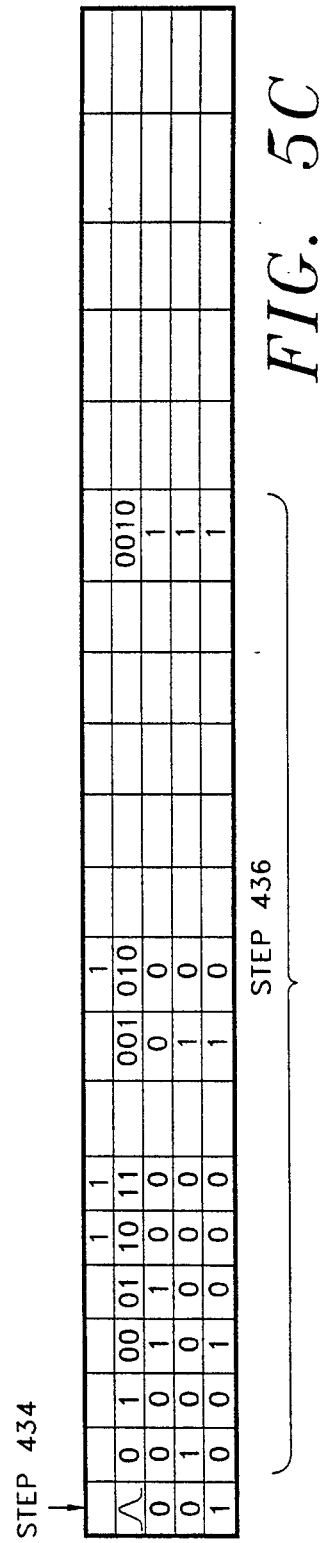
FIG. 5A  FIG. 5B  FIG. 5C

METHOD AND APPARATUS FOR COMPILING AND IMPLEMENTING STATE-MACHINE STATES AND OUTPUTS FOR A UNIVERSAL CELLULAR SEQUENTIAL LOCAL ARRAY

This is a continuation of co-pending application Ser. No. 07/168,376, filed on Mar. 15, 1988 and which designated the U.S., now abandoned.

BACKGROUND OF THE INVENTION

1. Field of the Invention

This invention relates to the field of digital logic circuits and sequential state machines.

2. Description of Related Art

Digital logic circuitry has proved generally useful for performing logical functions and transformations which may be required in the automated control of complex hardware. However, while a given logic circuit is adept at performing a particular specialized function, few logic circuits are capable of use in anything other than one specialized function. It is therefore generally required that a new logic circuit be designed and fabricated for each new function which is desired, leading to added cost of design and fabrication, and to reduced reliability as new logic circuits may fail due to "bugs" or errors.

In some applications, such as aerospace environments, the need for logic circuit control of complex hardware is acute, and the environment is generally intolerant of reliability errors. The cost of design and fabrication is exacerbated where there are many differing specialized functions to be performed, by the need to design each new logic circuit, by the "learning curve" experienced by process engineers in fabrication of each new logic circuit, and by reliability costs, e.g. testing and replacement, associated within each new logic circuit. Accordingly, there is a need for digital logic circuitry which is tailorable by software to perform any designated logic function.

A logic circuit which was capable of performing more than just one specialized function would obviate many of the problems noted above. Logic circuits which can perform any logic function, and which may be tailored by software to perform a specified function, are called "universal" logic circuits. Universal logic circuits are known by theory to fall into two classes: (1) "combinational" circuits, which may calculate any logic function of its inputs which does not require memory of earlier inputs, and (2) "sequential" circuits, which do have memory of earlier inputs. Construction of universal sequential logic circuits which are susceptible of fabrication with present technology has proved extremely difficult in the past. Accordingly, there is a need for a universal sequential logic circuit which is susceptible of fabrication with present technology.

SUMMARY OF THE INVENTION

A universal sequential logic circuit is constructed from a rectilinear array of elementary logic "cells", with a relatively large number of logic states embodied in a relatively small array. The set of states from a state-machine description of the logic function desired to be performed is compiled into a software association of cellular array states with each state-machine state, and the set of transitions from the state-machine description is compiled into a software association of logical connections between cells. The cellular array performs the state-machine function under software control.

Without limiting the generality of the invention, the rectilinear array generally embodies one bit of cellular array state information for each row of logic cells, stored in diagonal cells of the array called "memory cells". Non-diagonal cells of the array called "function cells" are controlled by stored software, which controls the transfer of cellular array state information from each row to each other.

Without limiting the generality of the invention, equivalence classes of state-machine states with respect to sequences of inputs are compiled, and one equivalence class of input sequences (i.e. a bit string representing a sequence of bits input to the array) is assigned to each memory cell. The contents of all memory cells collectively comprise a cellular array state. The function cells select which cellular array state follows the present one by selecting which logic state each memory cell in the array is to store next, each using a multiplexor under the control of stored memory bits.

BRIEF DESCRIPTION OF THE DRAWINGS

FIG. 4A shows a flow chart of a method of compiling a set of state-machine states into a set of cellular array states; FIG. 4B shows a set of related registers, including a compilation table.

FIGS. 5A, 5B and 5C is an example set out in terms of FIG. 4 illustrating compiling a state-machine into a cellular array, wherein FIG. 5A illustrates a state machine, input alphabet, internal states and output states of the state-machine; FIG. 5B illustrates a plurality of sequences for the input characters, the determination of equal effect up to the exhaustion of the untried active input strings; and FIG. 5C illustrates the substitution of binary values and testing for equal effect.

DESCRIPTION OF THE PREFERRED EMBODIMENT

Figure 1A:
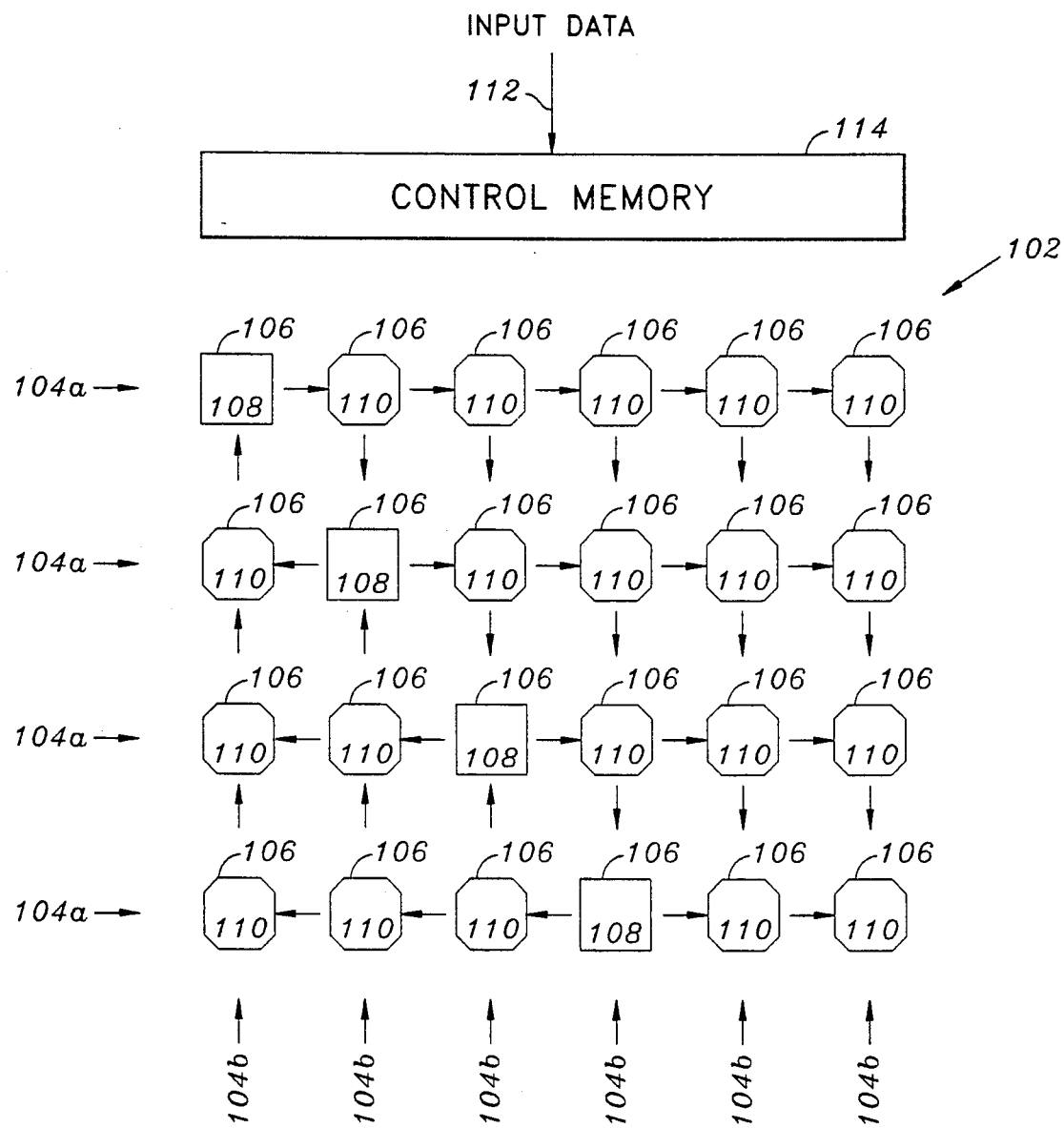
FIG. 1A is a block diagram of a cellular array of the present invention.

FIG. 1A is a block diagram of a cellular array of the present invention. A rectilinear array 102 comprises a set of rows 104a columns 104b of logic cells 106. Diagonal logic cells 106 are memory cells 108, while non-diagonal logic cells 106 are function cells 110. When the array 102 is square, there is one memory cell 108 per row 104a and per column 104b of logic cells 106, but when the array 102 is rectangular but not square, a set of rows 104a or a set of columns 104b will not have any memory cell 108. The array 102 shown is rectangular with excess columns 104b, so there is one memory cell 108 per row 104a.

Each memory cell 108 may store one bit of state information, so an (m)×(n) array 102 may store a total of (m) bits of state information. Each logic cell 106 is electrically connected to each of its neighbor logic cells 106, for transmitting bits of state information between memory cells 108. When the array 102 receives an input on line 112, each memory cell 108 and each function cell 110 operates under the control of software stored in control memory 114 to alter the state information recorded by the array 102, thus causing the array 102 to operate as a state-machine, as is well known in the art.

Figure 1B:
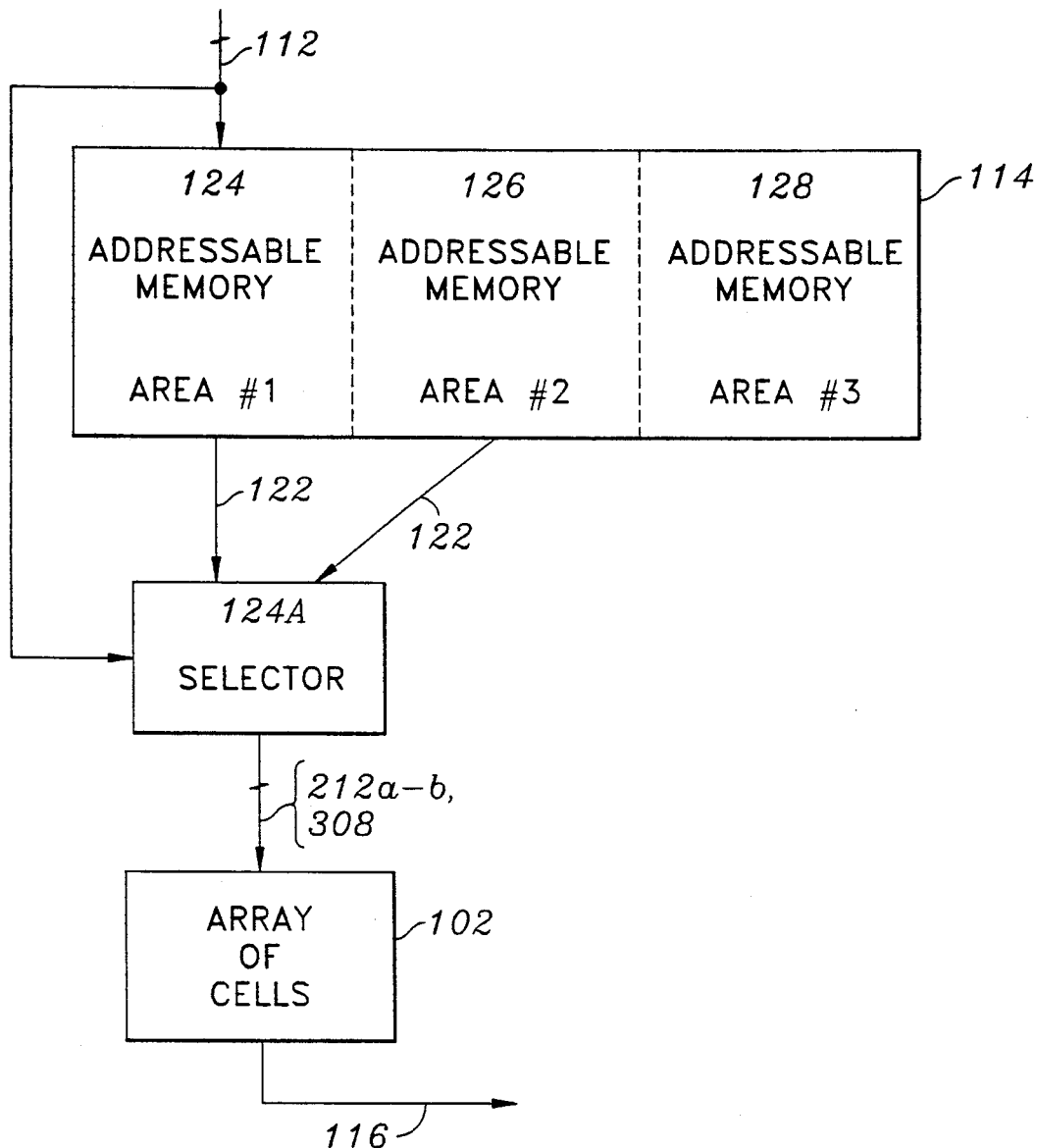
FIG. 1B is a block diagram of circuitry operating in conjunction with a control memory 114.

FIG. 1B is a block diagram of circuitry operating in conjunction with a control memory 114. A control memory 114 records control values to be output on control lines 122 through selector 124A to control logic cells 106. As disclosed below with reference to FIGS. 2-3, each memory cell 108 receives two control lines 212a-b from selector 124A and each function cell 110 receives one control line 308 from selector 124A. Selector 124A operates under control of input line 112 and lines 122 to select one set of a plurality of sets of control values output from control memory 114 and to transmit the selected set of control values on control lines 212a-b, 308.

A set of output values 116 of the cellular array 102 may be supplied as one or more functions of the states of memory cells 108. In a preferred embodiment, an output value 116 may be generated as a logic function of one or more memory cells 108 under control of software recorded in control memory 114.

In a preferred embodiment, control memory 114 may record control values to be output on control lines 122 in two areas 124 and 126 of addressable memory. Input lines 112 may be incorporated into an input address for accessing control memory 114, and thus perform the indicated selection operation by addressing one or the other of the areas 124 and 126 of addressable memory.

A portion of control memory 114 may control one or more output values 116. That portion of control memory 114 which controls output functions takes its inputs from columns containing only function cells 110, rather than from columns containing both function cells 110 and a memory cell 108. The control of an output function is similar to the control of a column containing a memory cell. An integer stored in a register of control memory 114 for a cellular array column containing a memory cell 108 addresses a horizontal logic line as a next state value for the memory cell 108 in that column. Similarly, an integer stored in a register of control register 114 for specifying an output function addresses a horizontal logic line as a next state value of an output value 116.

In an alternate embodiment, each output function can be derived as a combinational logic function of the output pins representing the present states of the memory cells 108, as is well known in the art.

Figure 2:
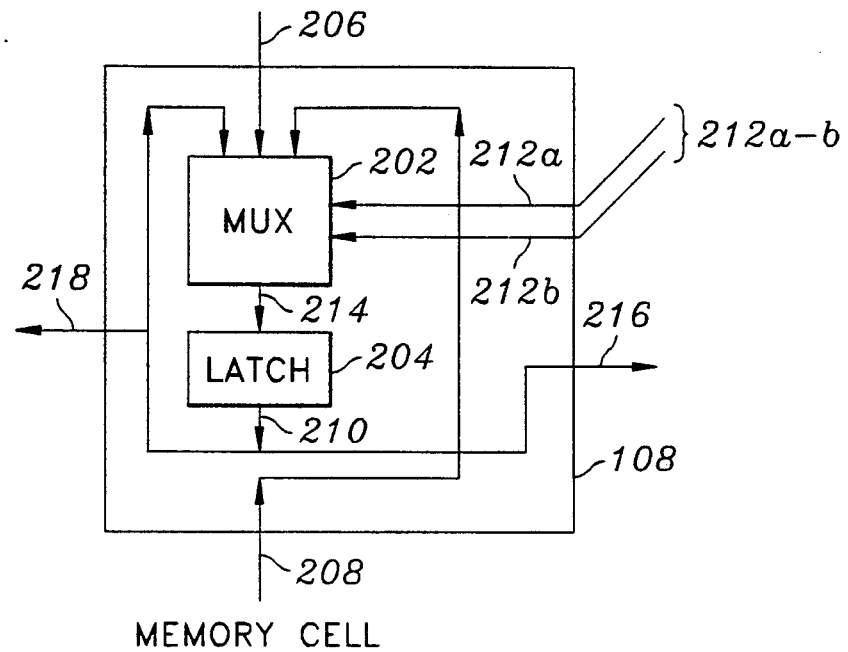
FIG. 2 is a circuit diagram of a memory cell of the present invention.

FIG. 2 is a circuit diagram of a memory cell 108 of the present invention. A memory cell 108 comprises a multiplexor 202, for selecting a next state bit to record, and a latch 204, for recording that state bit. One top input line 206 transmits the state bit from the function cell 110 immediately above the memory cell 108 in the array. If no such function cell 110 exists, no top input line 206 is used. Similarly, one bottom input line 208 transmits the state bit from the function cell 110 immediately below the memory cell 108 in the array. If no such function cell 110 exists, no bottom input line 208 is used. Finally, one repeat input line 210 transmits the state bit from the latch 204 back to the multiplexor 202. The multiplexor 202 selects one of the three input lines 206, 208, 210 under the control of two select bits received on lines 212a-b from control memory 114, and transmits the selected output on line 214. The latch 204 receives the selected output on line 214, records it, and propagates it on right output line 216 and on left output line 218.

Figure 3:
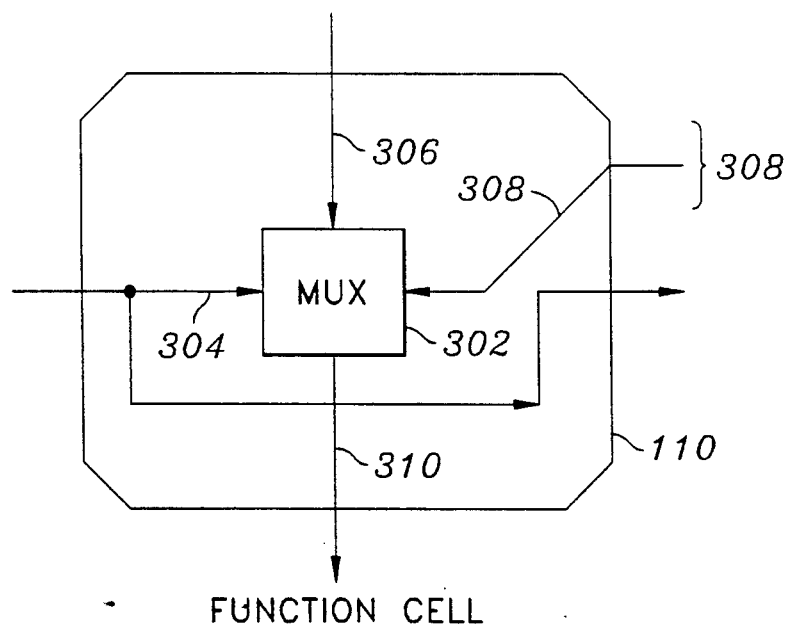
FIG. 3 is a circuit diagram of a function cell of the present invention.

FIG. 3 is a circuit diagram of a function cell 110 of the present invention. A function cell 110 comprises a multiplexor 302, for selecting a next state bit to transmit on its column 104b. One row input line 304 transmits the state bit from the logic cell 106 immediately to the left or right of the function cell 110 in the array. If the function cell 110 is above the diagonal, the row input line 304 will transmit on input from the left of the function cell 110, while if the function cell 110 is below the diagonal, the row input line 304 will transmit an input from the right of the function cell 110. (Thus, the same function cell 110 is simply rotated 180° when placed below the diagonal.) If no such logic cell 106 exists, no row input line 304 is used. Similarly, one column input line 306 transmits the state bit from the function cell 110 immediately above or below the logic cell 106 in the array. If the function cell 110 is above the diagonal, the column input line 306 will transmit an input from above the function cell 110, while if the function cell 110 is below the diagonal, the column input line 306 will transmit an input from below the function cell 110. If no such logic cell 106 exists, no column input line 306 is used. The multiplexor 302 selects one of the two input lines 304, 306 under the control of a select bits received on line 308 from control memory 114, and transmits the selected output on column output line 310.

FIG. 4A shows a flow chart of a method of compiling a set of state-machine states into a set of cellular array states; FIG. 4B shows a set of related registers, including a compilation table. Equivalence classes of input sequences are generated. The space of all possible input sequences is subjected to an exhaustive binary search, with sequences yielding duplicate effect being discarded, until all equivalence classes have been found. One memory cell state is then associated with each such equivalence class. The set of all memory cell states collectively comprise a cellular array state.

The compilation method of FIG. 4A may be performed by a computing element under the control of appropriate software, as is well known in the art. During operation of the compilation and assignment method of FIG. 4A, the computing element may make use of several registers in a memory 404, including a compilation table 406 having a set of rows 408 and columns 410 and a row entry 412 at the intersection of each row 408 and column 410.

Therefore, at step 422, the compilation table 406 is created with one row 408 for each state-machine state and one column 410 for each active input string 416. Initially, the null string Λ is the only active input string 416 and it is marked as untried. Each row entry 412 for the null string Λ is set equal to the state-machine state for its row 408.

At step 424, an untried active input string 416 is selected and called the old active input string 416. If no untried active input string 416 exists, control transfers to step 434 to terminate the compilation method of FIG. 4. Else every character 418 from the state-machine input alphabet 420 is marked untried, and control transfers to step 426.

At step 426, a character 418 from the state-machine input alphabet 420 is selected and marked as tried. Typically the entire state-machine input alphabet will comprise the characters "0" and "1". If no untried character 418 exists, control transfers to step 424 to try another selected active input string 416. Else control transfers to step 428.

At step 428, a new active string 416 is created, equal to the selected old active input string 416 with the selected character 418 from the state-machine input alphabet 420 appended. The new active input string 416 is marked untried.

At step 430, each row entry 412 is set equal to the resulting target state-machine state for the new active input string 416 created in step 428, applied one input symbol 418 at a time, in reverse order, to the same target state-machine states as in the row entries 412 in the column 410 corresponding to the null string Λ.

At step 432, the column 410 for the new active string 416 is compared with all previous columns 410 in the compilation table 406. If the new column 410 is a duplicate of any previous column 410, it is deleted and its active input string 416 is deleted.

At step 434, no further untried active input strings 416 exist. A binary string is assigned for each memory cell state. In one embodiment of the present invention, assignment of binary strings could be performed under a predetermined constraint, such as to conform binary strings to values to be output from the cellular array, or to yield a preferred ultimate size of the cellular array. In an alternate embodiment, assignment of binary strings could be performed automatically without reference to any such constraint.

At step 436, after substitution of the assigned binary strings for each memory cell state in each row entry 412, each column 410 is compared with each other column 410 for duplication. Any duplicate columns 410, and their associated active input strings 416, are eliminated.

At step 438, the search for equivalence classes is complete. One cellular array memory cell state is assigned for each remaining active input string 416 (and associated column 410).

At step 440, a control register 114 is programmed for control of transfer of information from each memory cell 108 to each other memory cell 108. As disclosed with reference to FIG. 1, the control register 114 may comprise a plurality of bits for controlling the selection of binary values which are transferred from each memory cell 108 to each other memory cell 108 upon input of input bit values, and for controlling the selection of binary values which are output by the cellular array 102.

The assignment of cellular array states and programming of the control register 114 may be done so as to satisfy predetermined constraints with respect to output behavior of the array 102. The size of the array and the choice of array states is best made so as to allow easy generation of output values for output to other circuitry in a circuit which includes the array 102 as a component. Thus, where a particular output function has been specified for the array 102 to generate, it is preferable for the particular output function to be generated by control memory 114 for a column of the array 102, as disclosed above with reference to FIG. 1a. In a preferred embodiment of the invention, additional output functions may be generated by adding further columns 104b controlled by appropriate control memory 114 to generate the predetermined output function. In an alternate embodiment of the invention, a predetermined output function may be generated by boolean combination of column output values using Boolean circuitry.

Thus, in a preferred embodiment of the invention, step 440 is performed with reference to predetermined constraints for an output value function. The cellular array which results is thus constructed to satisfy such predetermined constraints for output value functions, yet be constructed in a universal and modular manner.

The compilation Table 406, FIG. 5B, is initiated at step 422 with the Λ column extracted directly from FIG. 5A. After the execution of step 422, and, therefore, initially at step 424, the leftmost column of FIG. 5B is the only entry in the Compilation Table 406. At step 426, the 0 input character 418 is selected from the input alphabet 420; at step 428, this input character is appended to the old active Λ string to obtain a new active input string Λ0=0 (416); at step 430, the column entries for the new active input string 0, extracted directly from FIG. 5A, are completed; at step 432, the new column is compared with the existing Λ column for equal effect and entered into the Compilation Table 406 since the new column does not have equal effect. This new column is labelled "result of first loop of 426–432."

The execution of the second loop of steps 426–432 results in the third column of the compilation table, labelled accordingly in FIG. 5B. The execution of the second loop of steps 426–432 completes the first loop of steps 424–432, since both input characters 418 of the input alphabet 420 {0, 1} have been selected. The second and third columns of the Compilation Table 406 are jointly labelled accordingly.

The second loop of steps 424–432 yields the fourth and fifth columns of the Compilation Table 406—input characters 0 and 1, respectively, are appended to the old active 0 string to obtain new active input strings 416 to apply to the state table, FIG. 5A, in character reverse order. Columns 4 and 5 are labelled accordingly. The procedure continues through loop 424–432 until no untried active input string for selection at step 424 remains. The columns having input strings in the top row of FIG. 5B have equal effect with previous columns and therefore are not entered as active input strings.

At step 434, a binary value is assigned to each internal state, resulting in the leftmost column of FIG. 5C. At step 436, these assigned binary values replace the internal states of all unique columns of FIG. 5B, resulting in the remaining portion of FIG. 5C. Duplicate columns are tagged and deleted as before. At step 438, a unique memory cell (an element of the cellular array main diagonal) is assigned to each unique column of FIG. 5C. At step 440, control memory is programmed to enable routing between memory cells.

While a presently preferred embodiment has been disclosed herein, many variations are possible which remain within the scope of the invention.

I claim:

1. A method for operating a computing element to compile a set of internal states of a state-machine into a set of cellular array states for a cellular array and for implementing the state-machine in the cellular array; the state-machine having an input alphabet of input characters and at least one output function; the cellular array comprising (i) cells in a plurality of columns and rows wherein each cell along a main diagonal of the cellular array is a memory cell for storing information and each cell removed from the main diagonal is a function cell for transferring information between the memory cells, (ii) at least one output column of cells for providing an output value of the cellular array, and (iii) a control memory and selector means; the method comprising the steps of:

(a) generating a plurality of sequences of the input characters;

(b) applying the sequences of step (a) to the state-machine to derive a new internal state for each internal state of the state-machine and testing the sequences for equal effect on the internal states of the state-machine;

(c) selecting a set of binary values for substitution for each internal state so that the output value of the cellular array conforms to the at least one output function of the state-machine;

(d) substituting the selected set of binary values of step (c) for each new internal state derived in step (b) and testing the sequences for equal effect on the internal states with the substituted set of binary values; and (e) implementing the state-machine in the cellular array by:

(e)(i) assigning a memory cell to each sequence of characters found to have a unique effect in step (d) and storing the substituted binary values of step (d) in the memory cells as cellular array states; and (e)(ii) using the control memory and selector means for transferring information among the memory cells and for transferring information from the memory cells to the at least one output column of cells.

2. The method of claim 1 wherein the input characters of the sequences are applied to the state-machine in a reverse order in step (b).

3. The method of claim 1 wherein the input characters of the sequences are applied to the state-machine in a reverse order in step (b);

wherein the testing for equal effect in step (b) includes determining whether the application of a pair of sequences to the state-machine results in the state-machine having identical new internal states; and wherein the testing for equal effect in step (d) includes determining whether the application of a pair of sequences to the state-machine results in the state-machine having new internal states with identical substituted binary values.

4. The method of claim 1, further including the step of storing control information in the control memory for controlling the transfer of information in step (e)(ii).

5. The method of claim 1, wherein steps (a) and (b) include the steps of:

(a)(i) generating a null sequence and making the null sequence an untried active input sequence;

(a)(ii) selecting an input character from the input alphabet and appending the selected input character to the untried active input sequence to generate a new sequence;

applying step (b) for the new sequence generated in step (a)(ii) and making the new sequence generated in step (a)(ii) an untried active input sequence only if the new sequence has a unique effect on the set of internal states;

(a)(iii) repeating steps (a)(ii) and (b) until all input characters of the input alphabet have been selected; and (a)(iv) selecting a new untried active input sequence and repeating steps (a)(ii), (b), and (a)(iii) for the new untried active input sequence.

6. The method of claim 5 wherein the input characters of the sequences are applied to the state-machine in a reverse order in step (b).

7. Apparatus for compiling a set of internal states of a state-machine into a set of cellular array states for a cellular array and for implementing the state-machine in the cellular array; the state-machine having an input alphabet of input characters and at least one output function; the apparatus comprising:

(a) cells in a plurality of columns and rows of the cellular array wherein each cell along a main diagonal of the cellular array is a memory cell for storing information and each cell removed from the main diagonal is a function cell for transferring information between the memory cells;

(b) at least one output column of cells for providing an output value of the cellular array;

(c) a control memory and selector means;

(d) first means for generating a plurality of sequences of the input characters;

(e) second means for applying the sequences to the state-machine to derive a new internal state for each internal state of the state-machine and for testing the sequences for equal effect on the internal states of the state-machine;

(f) third means for selecting a set of binary values for substitution for each internal state so that the output value of the cellular array conforms to the at least one output function of the state-machine;

(g) fourth means for substituting the selected set of binary values for each new internal state and for testing the sequences for equal effect on the internal states with the substituted set of binary values; and (h) fifth means for implementing the state-machine in the cellular array including:

(i) means for assigning a memory cell to each sequence of characters found to have a unique effect and for storing the substituted binary values in the memory cells as cellular array states; and (ii) means for using the control memory and selector means for transferring information among the memory cells and for transferring information from the memory cells to the at least one output column of cells.

8. The apparatus of claim 7, wherein the second means applies the input characters of the sequences to the state-machine in a reverse order.

9. The apparatus of claim 7, wherein the second means applies the input characters of the sequences to the state-machine in a reverse order;

wherein the second means tests for equal effect by determining whether the application of a pair of sequences to the state-machine results in the state-machine having identical new internal states; and wherein the fourth means tests for equal effect by determining whether the application of a pair of sequences to the state-machine results in the state-machine having new internal states with identical substituted binary values.

10. The apparatus of claim 7, wherein the second and fourth means use a compilation table in testing the sequences for equal effect on the internal states, the compilation table storing each new internal state derived by applying the sequences to the state-machine and the substituted set of binary values for each new internal state.

11. The apparatus of claim 7 including a single control line from the selector means to each function cell for controlling the function cells and wherein the means for using the control memory uses control information in the control memory to control the selector means.

12. The apparatus of claim 7, wherein the first and second means;
- (d)(i) generate a null sequence and make the null sequence an untried active input sequence;
- (d)(ii) select an input character from the input alphabet and append the selected input character to the untried active input sequence to generate a new sequence;

apply the second means for the new sequence generated in (d)(ii) and make the new sequence generated in (d)(ii) an untried active input sequence only if the new sequence has a unique effect on the set of internal states;
- (d)(iii) repeat (d)(ii) and the application of the second means until all input characters of the input alphabet have been selected; and
- (d)(iv) select a new untried active input sequence and repeat (d)(ii), the application of the second means, and (d)(iii) for the new untried active input sequence.

13. The apparatus of claim 12, wherein the second means applies the input characters of the sequences to the state-machine in a reverse order.

* * * * *